(12) United States Patent
Lin et al.

(10) Patent No.: US 10,256,155 B1
(45) Date of Patent: Apr. 9, 2019

(54) METHOD FOR FABRICATING SINGLE DIFFUSION BREAK STRUCTURE DIRECTLY UNDER A GATE LINE

(71) Applicant: UNITED MICROELECTRONICS CORP., Hsin-Chu (TW)

(72) Inventors: Wen-Kai Lin, Yilan County (TW); Yi-Chung Sheng, Tainan (TW); Sheng-Yuan Hsueh, Tainan (TW); Chih-Kai Kang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/893,709

(22) Filed: Feb. 12, 2018

(30) Foreign Application Priority Data

Jan. 18, 2018 (CN) .......................... 2018 1 0048244

(51) Int. Cl.
| | |
|---|---|
| *H01L 29/78* | (2006.01) |
| *H01L 21/762* | (2006.01) |
| *H01L 23/528* | (2006.01) |
| *H01L 27/088* | (2006.01) |
| *H01L 21/8234* | (2006.01) |

(52) U.S. Cl.
CPC ........ *H01L 21/823481* (2013.01); *H01L 21/76224* (2013.01); *H01L 21/76229* (2013.01); *H01L 21/823431* (2013.01); *H01L 23/528* (2013.01); *H01L 27/0886* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 9,543,298 B1 * | 1/2017 | Zang | .............. H01L 27/0886 |
| 9,847,423 B1 | 12/2017 | Wei | |
| 2015/0054089 A1 * | 2/2015 | Hong | .............. H01L 21/762 257/401 |
| 2017/0062475 A1 * | 3/2017 | Song | .............. H01L 27/11807 |
| 2018/0183414 A1 * | 6/2018 | Guo | .............. G06F 17/5068 |

OTHER PUBLICATIONS

Definition of align downloaded from URL< https://www.merriam-webster.com/dictionary/align> on Nov. 9, 2018.*

* cited by examiner

*Primary Examiner* — J. E. Schoenholtz
(74) *Attorney, Agent, or Firm* — Winston Hsu

(57) ABSTRACT

A method for fabricating semiconductor device includes the steps of: forming a first active region and a second active region extending along a first direction on a substrate; forming a first single diffusion break (SDB) structure extending along a second direction between the first active region and the second active region; and forming a first gate line extending along the second direction intersecting the first active region and the second active region. Preferably, the first SDB structure is directly under the first gate line between the first active region and the second active region.

20 Claims, 3 Drawing Sheets

METHOD FOR FABRICATING SINGLE DIFFUSION BREAK STRUCTURE DIRECTLY UNDER A GATE LINE

BACKGROUND OF THE INVENTION

1. Field of the Invention

The invention relates to a method for fabricating semiconductor device, and more particularly to a method for forming single diffusion break (SDB) structure directly under a gate line.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: forming a first active region and a second active region extending along a first direction on a substrate; forming a first single diffusion break (SDB) structure extending along a second direction between the first active region and the second active region; and forming a first gate line extending along the second direction intersecting the first active region and the second active region. Preferably, the first SDB structure is directly under the first gate line between the first active region and the second active region.

According to another aspect of the present invention, a semiconductor device includes: a first active region and a second active region extending along a first direction on a substrate; a first single diffusion break (SDB) structure extending along a second direction between the first active region and the second active region; and a first gate line extending along the second direction intersecting the first active region and the second active region. Preferably, the first SDB structure is directly under the first gate line between the first active region and the second active region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
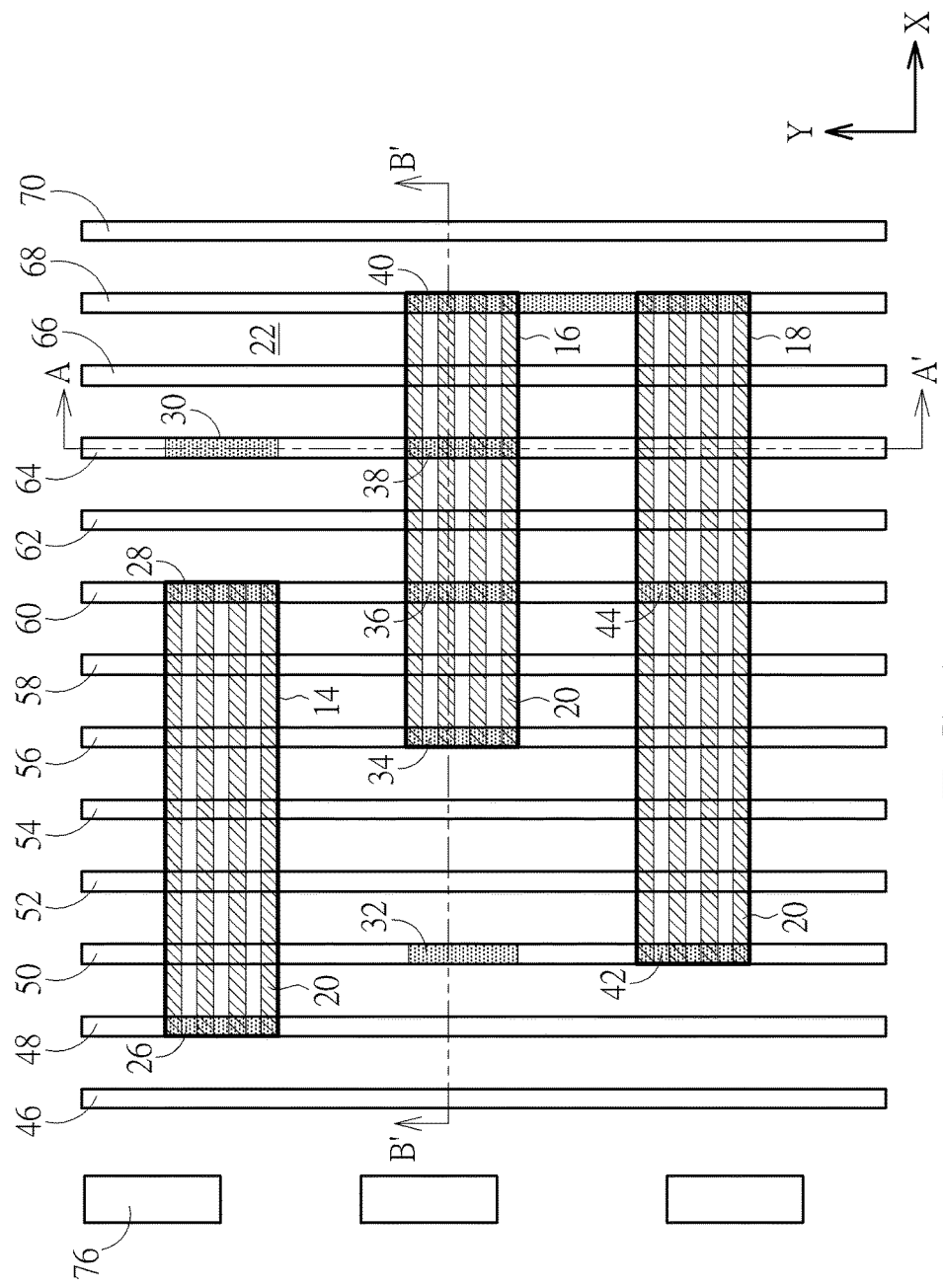
FIG. 1 is a top view illustrating a semiconductor device according to an embodiment of the present invention.
Figure 2:
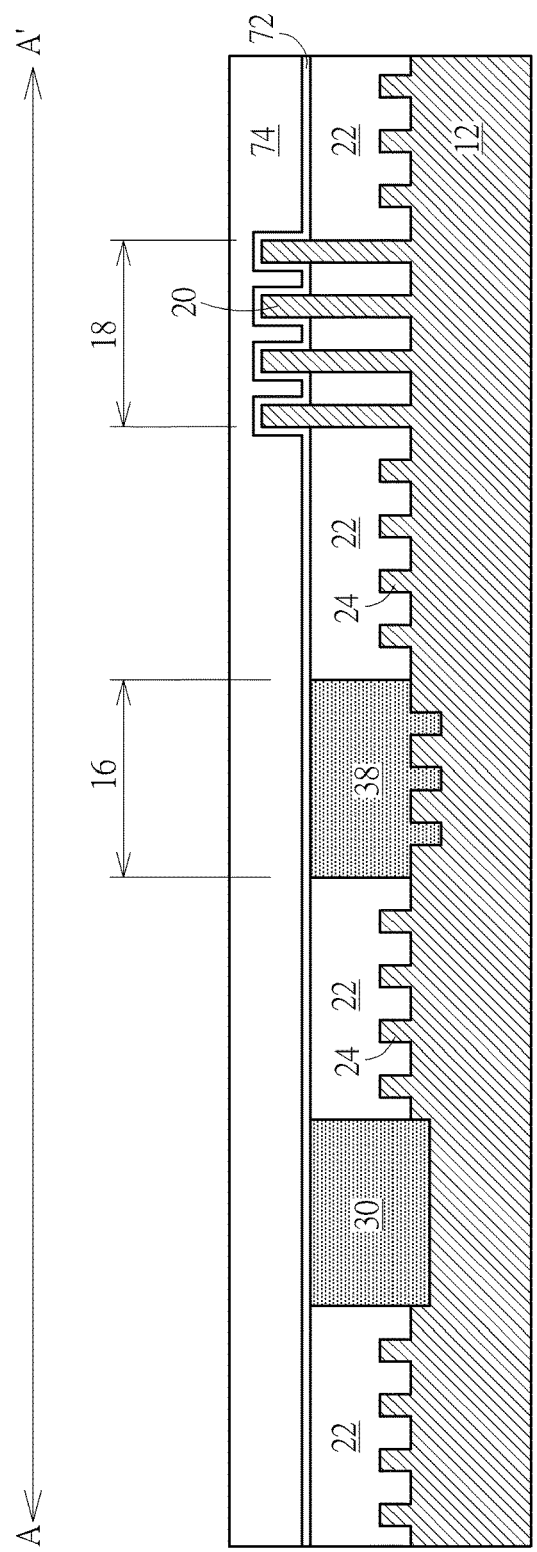
FIG. 2 illustrates a cross-sectional view of FIG. 1 along the sectional line AA'.
Figure 3:
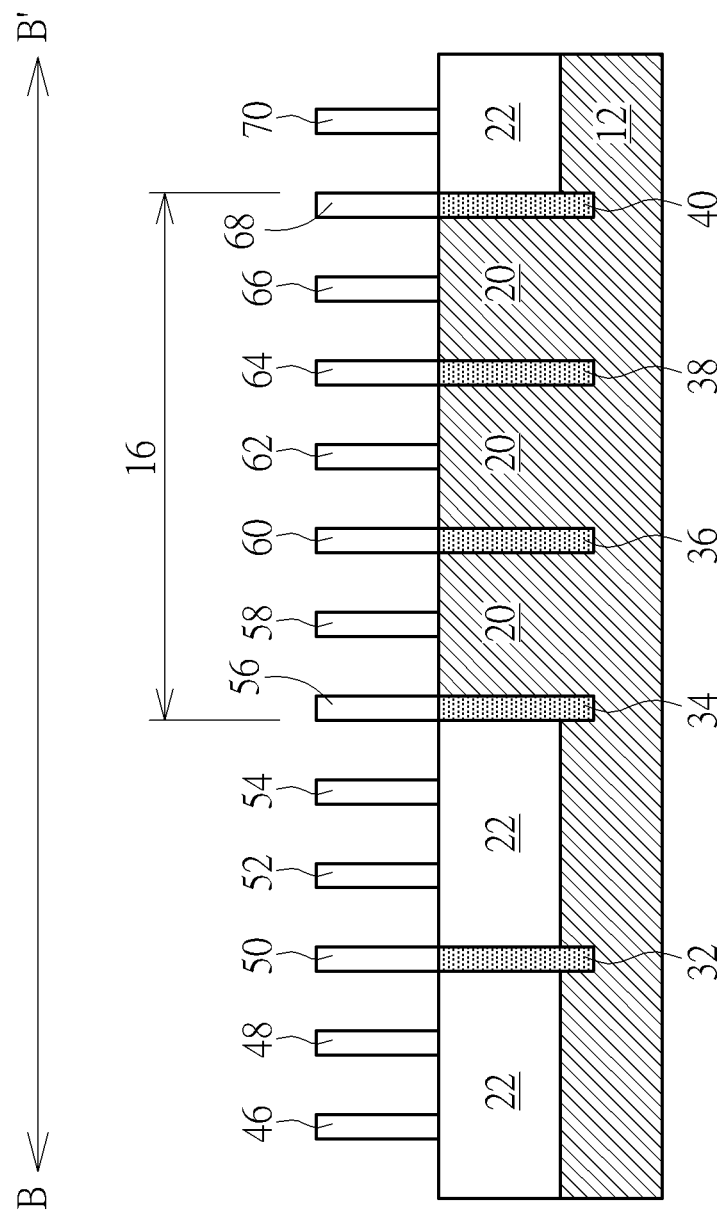
FIG. 3 illustrates a cross-sectional view of FIG. 1 along the sectional line BB'.

Referring to FIGS. 1-3, in which FIG. 1 is a top view illustrating a semiconductor device according to an embodiment of the present invention, FIG. 2 illustrates a cross-sectional view of FIG. 1 along the sectional line AA', and FIG. 3 illustrates a cross-sectional view of FIG. 1 along the sectional line BB'. As shown in FIGS. 1-3, a substrate 12 such as a silicon substrate or silicon-on-insulator (SOI) substrate is first provided, and at least an active region such as active regions 14, 16, 18 extending along a first direction (such as X-direction) are defined on the substrate 12. Next, a plurality of fin-shaped structures 20 are formed on each of the active regions 14, 16, 18 on the substrate 12 and a shallow trench isolation (STI) 22 is formed around the fin-shaped structures 20. It should be noted that even though four fin-shaped structures 20 are disposed on each of the active regions 14, 16, 18 on the substrate 12 in this embodiment, it would also be desirable to adjust the number of fin-shaped structures 20 depending on the demand of the product, which is also within the scope of the present invention.

Preferably, the fin-shaped structures 20 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained. It should be noted that some of the fin-shaped structures not removed completely could be remained on the active regions 14, 16, 18 to form bumps 24 after the fin cut process, in which the top surface of the bumps 24 is significantly lower than the top surface of the fin-shaped structures 20 within the active regions 14, 16, 18 but slightly higher than the top surface of the substrate 12.

Alternatively, the fin-shaped structures 20 could also be obtained by first forming a patterned mask (not shown) on the substrate, 12, and through an etching process, the pattern of the patterned mask is transferred to the substrate 12 to form the fin-shaped structures 20. Moreover, the formation of the fin-shaped structures 20 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 20. These approaches for forming fin-shaped structure are all within the scope of the present invention.

Next, a shallow trench isolation (STI) 22 is formed around the fin-shaped structures 20 or surrounding the active regions 14, 16, 18 as shown in FIG. 1. In this embodiment, the formation of the STI 22 could be accomplished by conducting a flowable chemical vapor deposition (FCVD) process to form a silicon oxide layer on the substrate 12 and covering the fin-shaped structures 20 entirely. Next, a chemical mechanical polishing (CMP) process along with etching process are conducted to remove part of the silicon oxide layer so that the top surface of the remaining silicon oxide is slightly lower than the top surface of the fin-shaped structures 20 for forming the STI 22. Preferably, the fin-shaped structures 20 disposed on the active regions 14, 16, 18 are disposed to protrude above the STI 22 while the STI 22 covers the bumps 24 entirely.

Next, a plurality of single diffusion break (SDB) structures are formed on the substrate 12. For instance, SDB structures 26, 28 are formed on two ends of the active region 14, SDB structures 30, 32 are formed adjacent to the active region 14, SDB structures 34, 36, 38 are formed in the active region 16, SDB structures 42, 44 are formed in the active region 18, and a SDB structures 40 is formed extending from the active region 16 to the active region 18.

In this embodiment, the formation of the SDB structures 26, 28, 30, 32, 34, 36, 38, 40, 42, 44 could be accomplished by first conducting a photo-etching process along a second direction (such as Y-direction) to remove part of the fin-shaped structures 20 and part of the STI 22 within the active regions 14, 16, 18 to form trenches (not shown) also extending along the Y-direction, and then depositing a dielectric material into the trenches to form SDB structures. It should be noted that even though an additional etching process is conducted to divide the fin-shaped structures 20 to form SDB structures 26, 28, 30, 32, 34, 36, 38, 40, 42, 44 after the STI 22 is formed in this embodiment, according to another embodiment of the present invention, it would also be desirable to conduct the aforementioned etching process to form trenches used for defining the SDB structures 26, 28, 30, 32, 34, 36, 38, 40, 42, 44, and then deposit a dielectric material into the trenches and around the fin-shaped structures 20 to form SDB structures 26, 28, 30, 32, 34, 36, 38, 40, 42, 44 and the STI 22 at the same time. In other words, the SDB structures 26, 28, 30, 32, 34, 36, 38, 40, 42, 44 could be formed either after the formation of STI 22 is completed or at the same time with the STI 22, which are all within the scope of the present invention.

Preferably, the SDB structures 26, 28, 30, 32, 34, 36, 38, 40, 42, 44 in this embodiment and the STI 22 could be made of same material or different while both the SDB structures 26, 28, 30, 32, 34, 36, 38, 40, 42, 44 and the STI 22 could be selected from the group consisting of silicon oxide and silicon nitride. For instance, even though the STI 22 is preferably made of silicon oxide while the SDB structures 26, 28, 30, 32, 34, 36, 38, 40, 42, 44 are made of silicon nitride in this embodiment, according to another embodiment of the present invention, both the STI 22 and the SDB structures 26, 28, 30, 32, 34, 36, 38, 40, 42, 44 could all be made of silicon oxide, which is also within the scope of the present invention.

Next, gate lines 46, 48, 50, 52, 54, 56, 58, 60, 62, 64, 66, 68, 70 or gate structures are formed on the fin-shaped structures 20 intersecting the active regions 14, 16, 18 and the STI 22. In this embodiment, the formation of the gate lines 46, 48, 50, 52, 54, 56, 58, 60, 62, 64, 66, 68, 70 could be accomplished by a gate first process, a high-k first approach from a gate last process, or a high-k last approach from the gate late process. For instance, a gate dielectric layer 72 or interfacial layer, a gate material layer 74 made of polysilicon, and a selective hard mask could be formed sequentially on the substrate 12, and a photo-etching process is then conducted by using a patterned resist (not shown) as mask to remove part of the gate material layer 74 and part of the gate dielectric layer 72 through single or multiple etching processes. After stripping the patterned resist, gate lines 46, 48, 50, 52, 54, 56, 58, 60, 62, 64, 66, 68, 70 each composed of a patterned gate dielectric layer 72 and a patterned material layer 74 are formed on the fin-shaped structure 20 and the STI 22.

As shown in FIG. 1, the gate lines 46, 48, 50, 52, 54, 56, 58, 60, 62, 64, 66, 68, 70 are extending along the same second direction (such as Y-direction) as the SDB structures 26, 28, 30, 32, 34, 36, 38, 40, 42, 44 and intersecting the active regions 14, 16, 18 and the fin-shaped structures 20, in which each of the SDB structures 26, 28, 30, 32, 34, 36, 38, 40, 42, 44 are disposed directly under each of the gate lines 46, 48, 50, 52, 54, 56, 58, 60, 62, 64, 66, 68, 70 respectively. For instance, the SDB structures 26 is directly under the gate line 48, the SDB structures 32, 42 are directly under the gate line 50, the SDB structure 34 is directly under the gate line 56, the SDB structures 28, 36, 44 are directly under the gate line 60, the SDB structures 30, 38 are directly under the gate line 64, and the SDB structure 40 is directly under the gate line 68.

In this embodiment, dummy isolation structures 76 could also be disposed in the STI 22 outside the active regions 14, 16, 18, the fin-shaped structures 20, and the gate lines 46, 48, 50, 52, 54, 56, 58, 60, 62, 64, 66, 68, 70. Preferably, no gate lines are disposed on top of the dummy isolation structures 76, the dummy isolation structures 76 and the SDB structures 26, 28, 30, 32, 34, 36, 38, 40, 42, 44 are formed through the same step, and the dummy isolation structure 76 and the STI 22 are preferably made of different material. For instance, the STI 22 in this embodiment is made of silicon oxide while the dummy isolation structures 76 are made of silicon nitride.

Preferably, the SDB structure 30 is disposed directly under the gate line 64 while not intersecting any of the active regions and fin-shaped structures 30, the SDB structure 38 is disposed directly under the same gate line 64 while intersecting the active region 16 and the fin-shaped structures 20, and the SDB structure 40 is extending from one edge of the active region 16 to another edge of the active region 18 while disposed directly under the gate line 68 and intersecting the active regions 16, 18 and the fin-shaped structures 20. In other words, the SDB structure 40 is disposed directly under the gate line 68 intersecting the active region 16, directly under the gate line 68 between the active region 16 and the active region 18, and directly under the gate line 68 intersecting the active region 18.

As shown in FIGS. 2-3, the top surface of the SDB structures 26, 28, 30, 32, 34, 36, 38, 40, 42, 44 is even with the top surface of the STI 22 while the bottom surface of the SDB structures 26, 28, 30, 32, 34, 36, 38, 40, 42, 44 and the STI 22 could have different profile and/or different depths depending on whether the SDB structures 26, 28, 30, 32, 34, 36, 38, 40, 42, 44 intersect the fin-shaped structures 20. For instance, as shown in FIG. 2, since the SDB structure 30 does not intersect any of the active regions 14, 16, 18 or fin-shaped structures 20, the bottom surface of the SDB structure 30 is substantially planar and slightly lower than the bottom surface of the adjacent STI 22. The bottom surface of the SDB structure 38 on the other hand reveals a jagged pattern or bumps since the profile of the fin-shaped structures 20 was etched downward during the aforementioned etching process. It should also be noted that even though the bottom of the SDB structure 30 is even with the bottom of the SDB structure 38 in this embodiment, the bottom of the SDB structure 30 could also be slightly lower than or higher than the bottom surface of the SDB structure 38, which is also within the scope of the present invention.

Next, MOS transistor fabrication process could be conducted by forming spacers adjacent to the gate lines 46, 48, 50, 52, 54, 56, 58, 60, 62, 64, 66, 68, 70, forming source/drain regions and/or epitaxial layers in the fin-shaped structures 20 adjacent to two sides of the spacers, and selectively forming a salicide (not shown) on the surface of the source/drain regions and/or epitaxial layers. Since the fabrication of MOS transistors is well known to those skilled in the art, the details of which are not explained herein for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a first active region and a second active region extending along a first direction on a substrate;
    forming a first single diffusion break (SDB) structure extending along a second direction between the first active region and the second active region, wherein an edge of the first SDB structure is aligned with and overlapping an edge of the first active region and an edge of the second active region; and
    forming a first gate line extending along the second direction intersecting the first active region and the second active region, wherein the first SDB structure is directly under the first gate line between the first active region and the second active region.

2. The method of claim 1, further comprising forming a shallow trench isolation (STI) around the first active region and the second active region.

3. The method of claim 2, wherein the first SDB structure is disposed in the STI.

4. The method of claim 2, wherein the first SDB structure and the STI comprise same material.

5. The method of claim 2, wherein the first SDB structure and the STI comprise different material.

6. The method of claim 1, wherein the first SDB structure extends from the first active region to the second active region.

7. The method of claim 1, wherein the first SDB structure is disposed under the first gate line intersecting the first active region and the first gate line between the first active region and the second active region.

8. The method of claim 1, wherein the first SDB structure is disposed under the first gate line intersecting the first active region, the first gate line between the first active region and the second active region, and the first gate line intersecting the second active region.

9. The method of claim 1, further comprising forming a second gate line extending along the second direction adjacent to the first gate line.

10. The method of claim 9, further comprising forming a second SDB structure directly under the second gate line and adjacent to the first active region.

11. A semiconductor device, comprising:
    a first active region and a second active region extending along a first direction on a substrate;
    a first single diffusion break (SDB) structure extending along a second direction between the first active region and the second active region, wherein an edge of the first SDB structure is aligned with and overlapping an edge of the first active region and an edge of the second active region; and
    a first gate line extending along the second direction intersecting the first active region and the second active region, wherein the first SDB structure is directly under the first gate line between the first active region and the second active region.

12. The semiconductor device of claim 11, further comprising a shallow trench isolation (STI) around the first active region and the second active region.

13. The semiconductor device of claim 12, wherein the first SDB structure is disposed in the STI.

14. The semiconductor device of claim 12, wherein the first SDB structure and the STI comprise same material.

15. The semiconductor device of claim 12, wherein the first SDB structure and the STI comprise different material.

16. The semiconductor device of claim 11, wherein the first SDB structure extends from the first active region to the second active region.

17. The semiconductor device of claim 11, wherein the first SDB structure is disposed under the first gate line intersecting the first active region and the first gate line between the first active region and the second active region.

18. The semiconductor device of claim 11, wherein the first SDB structure is disposed under the first gate line intersecting the first active region, the first gate line between the first active region and the second active region, and the first gate line intersecting the second active region.

19. The semiconductor device of claim 11, further comprising a second gate line extending along the second direction adjacent to the first gate line.

20. The semiconductor device of claim 19, further comprising a second SDB structure directly under the second gate line and adjacent to the first active region.

* * * * *